United States Patent
Gilmore et al.

(10) Patent No.: US 8,642,879 B2
(45) Date of Patent: Feb. 4, 2014

(54) SYSTEM FOR COUPLING PHOTOVOLTAIC ARRAYS

(75) Inventors: Jack Arthur Gilmore, Fort Collins, CO (US); Eric Seymour, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 157 days.

(21) Appl. No.: 13/053,331

(22) Filed: Mar. 22, 2011

(65) Prior Publication Data

US 2011/0168229 A1    Jul. 14, 2011

Related U.S. Application Data

(60) Division of application No. 12/184,535, filed on Aug. 1, 2008, which is a continuation-in-part of application No. 12/022,147, filed on Jan. 29, 2008, now Pat. No. 7,768,751.

(60) Provisional application No. 60/953,875, filed on Aug. 3, 2007.

(51) Int. Cl.
*H01L 31/042* (2006.01)

(52) U.S. Cl.
USPC ......................................................... 136/244

(58) Field of Classification Search
None
See application file for complete search history.

(56) References Cited

U.S. PATENT DOCUMENTS

| | | |
|---|---|---|
| 3,986,097 A | 10/1976 | Woods |
| 4,025,862 A | 5/1977 | Gautheron |
| 4,054,827 A | 10/1977 | Reimers |
| 4,080,646 A | 3/1978 | Dietrich |
| 4,128,793 A | 12/1978 | Stich |
| 4,161,023 A | 7/1979 | Goffeau |
| 4,531,085 A | 7/1985 | Mesenhimer |
| 4,678,983 A | 7/1987 | Rouzies |
| 4,748,311 A | 5/1988 | Thomas |
| 5,270,636 A | 12/1993 | Lafferty |
| 5,451,962 A | 9/1995 | Steigerwald |
| 5,781,419 A | 7/1998 | Kutkut et al. |
| 5,923,100 A | 7/1999 | Lukens et al. |

(Continued)

FOREIGN PATENT DOCUMENTS

| | | |
|---|---|---|
| JP | 08-98549 A1 | 2/1978 |
| JP | 07-049721 A | 2/1995 |

(Continued)

OTHER PUBLICATIONS

IEEE, "Std. 519-1992", "IEEE Recommended Practices", Apr. 12, 1993, pp. 1-100, Publisher: IEEE.

(Continued)

*Primary Examiner* — Miriam Berdichevsky
*Assistant Examiner* — Shannon Gardner
(74) *Attorney, Agent, or Firm* — Neugeboren O'Dowd PC

(57) ABSTRACT

System, methods and apparatus for coupling photovoltaic arrays are disclosed. The apparatus may include a first input adapted to couple to a neutral line of a first photovoltaic array; a second input adapted to couple to a neutral line of a second photovoltaic array; a contactor configured to switchably couple the neutral line of a first photovoltaic array to the a neutral line of a second photovoltaic array, the contactor being controllable by an electric control signal; and a control input adapted to couple the switch to a remotely located controller so as to enable the controller to control the first switch by sending the electric control signal.

9 Claims, 5 Drawing Sheets

(56) References Cited

U.S. PATENT DOCUMENTS

| | | |
|---|---|---|
| 5,932,994 A | 8/1999 | Jo et al. |
| 6,093,885 A | 7/2000 | Takehara et al. |
| 6,115,273 A | 9/2000 | Geissler |
| 6,266,260 B1 | 7/2001 | Zahrte, Sr. et al. |
| 6,404,655 B1 | 6/2002 | Welches |
| 6,414,866 B2 | 7/2002 | Huggett et al. |
| 6,625,046 B2 | 9/2003 | Geissler |
| 6,750,391 B2 | 6/2004 | Bower et al. |
| 6,812,396 B2 | 11/2004 | Makita et al. |
| 6,844,739 B2 | 1/2005 | Kasai et al. |
| 6,914,418 B2 | 7/2005 | Sung |
| 7,053,506 B2 | 5/2006 | Alonso et al. |
| 7,158,395 B2 | 1/2007 | Deng et al. |
| 7,193,872 B2 | 3/2007 | Siri et al. |
| 7,292,419 B1 | 11/2007 | Nemir |
| 7,371,963 B2 | 5/2008 | Suenaga et al. |
| 7,456,524 B2 | 11/2008 | Nielsen et al. |
| 7,619,200 B1 | 11/2009 | Seymour et al. |
| 7,701,081 B2 | 4/2010 | Seymour |
| 7,768,751 B2 | 8/2010 | Gilmore et al. |
| 2001/0004322 A1 | 6/2001 | Kurokami et al. |
| 2001/0023703 A1 | 9/2001 | Kondo et al. |
| 2001/0048605 A1 | 12/2001 | Kurokami et al. |
| 2002/0105765 A1 | 8/2002 | Kondo et al. |
| 2003/0111103 A1 | 6/2003 | Bower et al. |
| 2003/0155887 A1 | 8/2003 | Bourilkov et al. |
| 2003/0172968 A1 | 9/2003 | Armer et al. |
| 2004/0041665 A1 | 3/2004 | Hode et al. |
| 2004/0211459 A1 | 10/2004 | Suenaga et al. |
| 2005/0139259 A1 | 6/2005 | Steigerwald et al. |
| 2005/0180181 A1 | 8/2005 | Gaudreau et al. |
| 2006/0162772 A1 | 7/2006 | Presher, Jr. et al. |
| 2006/0171182 A1 | 8/2006 | Siri et al. |
| 2006/0221653 A1 | 10/2006 | Lai et al. |
| 2006/0227472 A1 | 10/2006 | Taylor et al. |
| 2008/0291706 A1 | 11/2008 | Seymour et al. |
| 2009/0032082 A1 | 2/2009 | Gilmore et al. |
| 2009/0078304 A1 | 3/2009 | Gilmore et al. |
| 2009/0167086 A1 | 7/2009 | Seymour |
| 2009/0167097 A1 | 7/2009 | Seymour et al. |
| 2009/0190275 A1 | 7/2009 | Gilmore et al. |
| 2009/0217964 A1 | 9/2009 | Gilmore et al. |
| 2009/0283130 A1 | 11/2009 | Gilmore et al. |
| 2010/0132758 A1 | 6/2010 | Gilmore |
| 2010/0308662 A1 | 12/2010 | Schatz et al. |
| 2011/0157753 A1 | 6/2011 | Gilmore et al. |

FOREIGN PATENT DOCUMENTS

| | | |
|---|---|---|
| JP | 09-054623 A2 | 2/1997 |
| JP | 10-014111 A | 1/1998 |
| JP | 10-229679 A | 8/1998 |
| JP | 11-285260 A | 10/1999 |
| JP | 2000-295786 A | 10/2000 |
| JP | 2000-358370 A | 12/2000 |
| JP | 2002-319687 A | 10/2002 |
| JP | 2003-124492 A | 4/2003 |
| JP | 2004-015941 A | 1/2004 |
| JP | 2004-343909 A | 12/2004 |
| JP | 2005-204485 A | 7/2005 |
| JP | 2006-187150 A | 7/2006 |
| JP | 2007133765 A | 5/2007 |
| JP | 2007-201257 A | 8/2007 |
| KR | 10-2006-0100840 | 9/2006 |
| KR | 20-2006-0021132 | 10/2006 |
| WO | 2007022955 A1 | 8/2006 |
| WO | 2010065388 A1 | 6/2010 |
| WO | 2011011022 A1 | 1/2011 |
| WO | 2011094654 A1 | 8/2011 |

OTHER PUBLICATIONS

Yao, Gang, et al., "Interleaved Three-Level Boost Converter with Zero Diode Reverse-Recovery Loss", "Applied Power Electronics Conference and Exposition", Sep. 1, 2004, pp. 1090-1095, vol. 2, Publisher: IEEE, Published in: US.

Zhang, Michael T., et al., "Single-Phase Three-Level Boost Power Factor Correction Converter", "Applied Power Electronic Conference and Exposition", Mar. 1, 1995, pp. 434-439, vol. 1, Publisher: IEEE, Published in: US.

Gow, J.A., et al., "Photovoltaic Converter System Suitable for Use in Small Scale Stand-Alone or Grid Connected Applications", "Proceedings Electric Power Applications", Nov. 1, 2000, pp. 535-543, vol. 147, No. 6, Publisher: IEEE, Published in: US.

Pinheiro, J.R., et al., "Dual Output Three-Level Boost Power Factor Correction Converter with Unbalanced Loads", "Power Electronics Specialists Conference", Jun. 1, 1996, pp. 733-739, vol. 1, Publisher: IEEE, Published in: US.

Kwon, Jung-Min, et al., "Photovoltaic Power Conditioning System with Line Connection", "Transaction on Industrial Electronics", Aug. 1, 2006, pp. 1048-1054, vol. 53, No. 4, Publisher: IEEE, Published in: US.

Enslin, Johan, et al., "Integrated Photovoltaic Maximum Power Point Tracking Converter", "Transactions on Industrial Electronics", Dec. 1, 1997, pp. 769-773, vol. 44, No. 6, Publisher: IEEE, Published in: US.

Walker, Geoffrey R., et al., "Cascaded DC-DC Converter Connection of Photovoltaic Modules", "Transactions on Power Electronics", Jul. 1, 2004, pp. 1130-1139, vol. 19, No. 4, Publisher: IEEE, Published in: US.

Kim, Jung-Han, et al., "A Study on the Harmonic Elimination used Passive Filter and Active Filter", "KIIEE", 2001, pp. 77-83, Publisher: KIIEE, Published in: KR.

Ahmed, K.H., et al., "Passive Filter Design for Three-Phase Inverter Interfacing in Distributed Generation", "Electrical Power Quality and Utilization Journal", 2007, pp. abstract, Fig. 1 19, vol. 13, No. 2, Published in: US.

Sohn, Seung C., Notice of Non-Compliant Amendment Office Action re U.S. Appl. No. 12/189,187, Aug. 12, 2009, p. 2, Published in: US.

Nguyen, Danny, Office Action re U.S. Appl. No. 12/022,147, Jan. 22, 2010, p. 46, Published in: US.

Sohn, Seung C., Office Action re U.S. Appl. No. 12/189,187, Apr. 3, 2009, p. 14, Published in: US.

Nguyen, Danny, Office Action re U.S. Appl. No. 12/830,380, Jun. 3, 2011, p. 28, Published in: US.

Gardner, Shannon M., Office Action re U.S. Appl. No. 12/184,535, Jun. 17, 2011, p. 9, Published in: US.

Bernier, Lindsey A., Office Action re U.S. Appl. No. 12/326,209, Jun. 28, 2011, p. 7, Published in: US.

Henry E. Lee, III, Office Action re U.S. Appl. No. 13/122,950, Jul. 14, 2011, p. 43 Published in: US.

Sohn, Seung C., Office Action re U.S. Appl. No. 11/967,933, Oct. 4, 2010, p. 29, Published in: US.

Gardner, Shannon M., Office Action re U.S. Appl. No. 12/184,535, Nov. 10, 2010, p. 7, Published in: US.

Borroto, Alfonso Perez, Office Action re U.S. Appl. No. 12/507,019, Nov. 14, 2011, p. 51, Published in: US.

Michael Rutland Wallis, Office Action re U.S. Appl. No. 12/326,209, Nov. 17, 2011, p. 31, Published in: US.

Korean Intellectual Property Office, Office Action re Korean Application No. 10-2009-7025699, Jun. 1, 2011, p. 12, Published in: KR.

Choi, Nam Ho, PCT International Search Report re Application No. PCT/US08/064263, Oct. 31, 2008, Published in: PCT.

Park, Jae Hun, PCT International Search Report re Application No. PCT/US08/072108, Feb. 24, 2009, Published in: PCT.

Moyse, Ellen, International Preliminary Report on Patentability and Written Opinion re Application No. PCT/US08/072108, Feb. 18, 2010, Published in: PCT.

Koh, Jae Hyun, PCT International Search Report re Application No. PCT/US08/077734, Apr. 29, 2009, Published in: PCT.

Bae, Jin Yong, PCT International Search Report re Application No. PCT/US08/086931, Jun. 25, 2009, Published in: PCT.

Bae, Jin Yong, PCT International Search Report re Application No. PCT/US08/087078, Jul. 9, 2009, Published in: PCT.

Han, Sang Il, PCT International Search Report re Application No. PCT/US09/031549, Aug. 17, 2009, Published in: PCT.

Nickitas-Etienne, Athina, International Preliminary Report on Patentability and Written Opinion re Application No. PCT/US09/031549, Aug. 12, 2010, Published in: PCT.

(56) References Cited

OTHER PUBLICATIONS

Ha, Jeong Kyun, PCT International Search Report re Application No. PCT/US09/051855, Mar. 22, 2010, Published in: PCT.

Honda, Masashi, International Preliminary Report on Patentability and Written Opinion re Application PCT/US09/051855, Feb. 24, 2011, Published in: PCT.

Ha, Jeong Kyun, PCT International Search Report re Application No. PCT/US09/054904, Aug. 23, 2010, Published in: PCT.

Guinea, William, PCT International Search Report re Application No. PCT/US09/065629, Feb. 12, 2010, Published in: PCT.

Athina Nickitas-Etienne, International Preliminary Report on Patentability re Application No. PCT/US09/65629, Jun. 16, 2011, Published in: CH.

O'Dowd, Sean R., Response to Oct. 4, 2010 Office Action re U.S. Appl. No. 11/967,933, Jan. 1, 2011, p. 6, Published in: US.

O'Dowd, Sean R., Response to Jan. 22, 2010 Office Action re U.S. Appl. No. 12/022,147, Feb. 25, 2010, p. 28, Published in: US.

O'Dowd, Sean R., Response to Nov. 10, 2011 Office Action re U.S. Appl. No. 12/184,535, Mar. 10, 2011, p. 14, Published in: US.

O'Dowd, Sean R., Response to Apr. 3, 2009 Office Action re U.S. Appl. No. 12/189,187, Jun. 29, 2009, p. 51, Published in: US.

Sean R. O'Dowd, Response to Jun. 28, 2011 Office Action re U.S. Appl. No. 12/326,209, Jul. 28, 2011, Published in: US.

O'Dowd, Sean R., Response to Notice of Non-Compliant Amendment re U.S. Appl. No. 12/189,187, Aug. 13, 2009, p. 10, Published in: US.

Sean R. O'Dowd, Response to Jun. 3, 2011 Office Action re U.S. Appl. No. 12/830,380, Sep. 16, 2011, Published in: US.

Chinese Patent Office, Second Office Action re Chinese Application No. 200880101640.4, Mar. 21, 2012, p. 29, Published in: CN.

Chinese Patent Office, Office Action re Chinese Patent Application No. 200880016950.6, Apr. 17, 2012, p. 20, Published in: CN.

Japanese Patent Office, Office Action re Japanese Application No. 2010-519272, May 25, 2012, p. 7, Published in: JP.

Korean Patent Office, Office Action re Korean Patent Application No. 10-2011-7004034, Jun. 19, 2012, p. 5, Published in: KR.

Korean Patent Office, Office Action re Korean Patent Application No. 10-2010-7002310, Aug. 13, 2012, p. 6, Published in: KR.

Rutland Wallis, Michael, Office Action re U.S. Appl. No. 12/326,209, Mar. 23, 2012, p. 22, Published in: US.

Lee III, Henry E., Office Action re U.S. Appl. No. 12/122,950, Jun. 7, 2012, p. 20.

Lindner, Nora, International Preliminary Report on Patentability re Application No. PCT/US12/023081, Aug. 9, 2012, Published in: CH.

O'Dowd, Sean R., Response After Final Under 37 CFR 1.116 re U.S. Appl. No. 12/326,209, May 23, 2012, p. 6, Published in: US.

Sun Power, "Sun Power Discovers the Surface Polarization Effect in High Efficiency Solar Cells", Aug. 1, 2005, Published in: US.

Wang, T.C., et al., "Output Filter Design for a Grid-Interconnected Three-Phase Inverter", "IEEE", 2003, pp. 779-784, Publisher: IEEE, Published in: US.

Kolev, Vesselin, International Search Report and Written Opinion re Application PCT/US11/023081, Apr. 27, 2011, p. 12, Published in: AU.

Woo Hyuk Lee, "A Study on the Optimization of Input Filter for Switching Inverter", "Master Thesis", 1989, Publisher: Hanyang University.

SYSTEM FOR COUPLING PHOTOVOLTAIC ARRAYS

PRIORITY

The present application is a Divisional Application of U.S. application Ser. No. 12/184,535, filed Aug. 1, 2008 entitled System, Method, and Apparatus for Coupling Photovoltaic Arrays, which is a continuation-in-part of U.S. application Ser. No. 12/022,147, filed Jan. 29, 2008 entitled System and Method for Ground Fault Detection and Interruption and claims priority to provisional patent application No. 60/953,875, filed Aug. 3, 2007, entitled: High Power Photovoltaic System and Method, both of which are incorporated by reference herein in their entirety.

FIELD OF THE INVENTION

This invention relates generally to apparatus and methods for converting solar energy to electrical energy, and more specifically to apparatus and methods for coupling photovoltaic arrays with energy conversion and/or energy distribution equipment.

BACKGROUND OF THE INVENTION

Renewable energy is capturing an increasing amount of attention. And among renewable energy sources, the use of solar energy for generating electricity is now a viable option for many electrical energy needs, and solar energy will become more and more viable relative to other applications. In the context of electrical generation systems (e.g., photovoltaic systems greater than 100 kW), the performance, reliability and regulatory aspects of three-phase grid-tie photovoltaic (PV) inverters and the arrays to which they are connected are issues that will continue to garner attention.

Development of this class of equipment for the North American market over recent years has resulted in a set of commonly encountered characteristics. These attributes, while acquired through experience and adversity, have led to the present-day condition where the dominant indices of performance, particularly energy efficiency, have plateaued, and as a consequence, new solutions and approaches are needed to provide performance improvement.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In one embodiment, the invention may be characterized as a photovoltaic energy conversion system that includes a first photovoltaic array configured to generate direct current (DC) power, the first photovoltaic array is disposed above ground potential and includes a positive rail and a first neutral line; a second photovoltaic array configured to generate direct current (DC) power, the second photovoltaic array is disposed below ground potential and includes a negative rail and a second neutral line; and a power conversion component remotely coupled to both, the positive rail of the first photovoltaic array and the negative rail of the second photovoltaic array, the power conversion component adapted to convert a voltage between the positive rail of the first photovoltaic array and the negative rail of the second photovoltaic array from one form to another form; and a photovoltaic tie coupled between the first photovoltaic array and the second photovoltaic array, the photovoltaic tie is configured to couple the first neutral line of the first photovoltaic array to the second neutral line of the second photovoltaic array while the first and second photovoltaic arrays are providing power to the power conversion component and to uncouple the first neutral line of the first photovoltaic array from the second neutral line of the second photovoltaic array when the first and second photovoltaic arrays are not providing power to the power conversion component.

In accordance with another embodiment, the invention may be characterized as a method for controlling a photovoltaic array, the method including coupling a neutral line of a first photovoltaic array to a neutral line of a second photovoltaic array so as to place the first photovoltaic array above ground potential and the second photovoltaic array below ground potential; converting, remote from a location of the first and second photovoltaic arrays, power from the first and second arrays from one form to another form; and controlling, at least in part from a location remote from the neutral lines of the first and second arrays, the coupling of the neutral line of the first photovoltaic array to the neutral line of the second photovoltaic array.

In accordance with yet another embodiment, the invention may be characterized as an apparatus for coupling photovoltaic arrays that includes a first input adapted to couple to a neutral line of a first photovoltaic array; a second input adapted to couple to a neutral line of a second photovoltaic array; a first switch configured to switchably couple the neutral line of a first photovoltaic array to the a neutral line of a second photovoltaic array, the first switch being controllable by an electric control signal; a control input adapted to couple the switch to a remotely located controller so as to enable the controller to control the first switch by sending the electric control signal.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
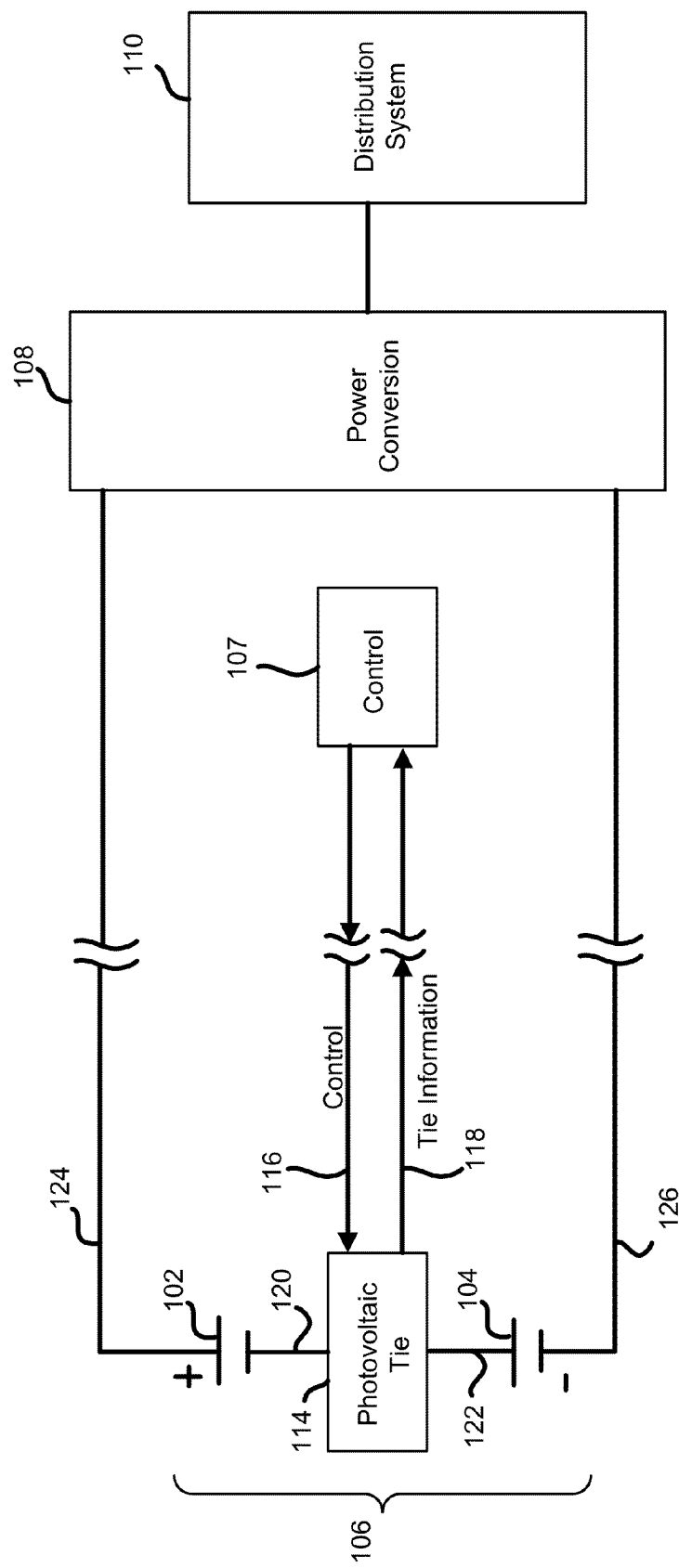
FIG. 1 is a block diagram depicting an exemplary embodiment of a photovoltaic energy conversion system.

Referring first to FIG. 1, shown is a block diagram of an exemplary embodiment of the present invention. As shown, in this embodiment a first set 102 and a second set 104 of photovoltaic arrays are coupled together by a photovoltaic tie 114 to create a bipolar panel array 106 that is remotely coupled to a power conversion component 108, which is disposed between the panel array 106 and a distribution system 110. Also depicted is a photovoltaic tie 114 that is disposed between the a first set 102 and a second set 104 of photovoltaic arrays and is remotely coupled to a control portion 107 by control lines 116 and tie-information lines 118.

The illustrated arrangement of the components depicted in FIG. 1 is logical and not meant to be an actual hardware diagram; thus, additional components can be added or combined with the components that are depicted in an actual implementation. It should also be recognized that the components, in light of the disclosure herein, may be readily implemented by one of ordinary skill in the art.

As an example, the control portion 107 is depicted as a separate functional component from the power conversion component 108, but the control portion 107 may be realized by components housed within the power conversion component 108 or distributed among the power conversion component 108 and the photovoltaic tie 114. Moreover, the power conversion component 108 is depicted as coupling directly to the array 106, but this is certainly not required. In some embodiments, for example, a PV interface is interposed between the array 106 and the power conversion component 108. In these embodiments, the PV interface generally operates to enable the power conversion component 108, which may designed to operate at lower voltages than the open-load, rail-to-rail voltage of the array 106, to be utilized in connection with the PV array 106 that operates at least a portion of the time (e.g., while unloaded) at a voltage that exceeds the designed operating voltage of the power conversion component 108. U.S. application Ser. No. 11/967,933, entitled Photovoltaic Inverter Interface Device, System and Method, which is incorporated herein by reference, discloses exemplary PV interfaces that may be utilized in connection with one or more embodiments of the present invention.

In general, the photovoltaic array 106 converts solar energy to DC electrical power, which may be converted to another form of power (e.g., three-phase AC power or higher-voltage DC power) by the power conversion component 108. As shown, the power that is output by the power conversion component 108 is applied to the distribution system 110, which in many embodiments is the three phase distribution system of a demand-side energy consumer (e.g., a commercial entity, industrial entity, or collection of residential units). In other embodiments, however, it is contemplated that the distribution system 110 is on or more portions of a utility distribution system.

In some embodiments, the cells in the array 106 include crystalline (e.g., monocrystalline or polycrystalline) silicon that operates in an open load state at 1200 Volts and operates in a loaded state between 660 and 960 Volts. And in other embodiments the array includes cells comprising amorphous silicon that operates in an open load state at 1400 Volts and a loaded state around 900 Volts. One of ordinary skill in the art will appreciate, however, that the photovoltaic array 106 may include a variety of different type photovoltaic cells that are disposed in a variety of different configurations. For example, the photovoltaic cells may be arranged in parallel, in series or a combination thereof.

Under traditional ground referencing of either the positive or negative rail of a mono-polar array, to comply with low-voltage regulations (e.g., U.S. National Electric Code (NEC)), the voltage of the mono-polar array is limited to 600 VDC. And given the substantial increase in cost to employ medium-voltage equipment, mono-polar arrays are limited in operational performance.

In the present embodiment, however, the center of the arrays 102, 104 are tied together in a "bi-polar" configuration, which enables the overall PV voltage to double before violating NEC low-voltage limits Aside from efficiency gains from operating at a higher voltage, a direct conversion (e.g., without a transformer) into 480 VAC is possible; thus eliminating the ratio-changing function of the transformer. U.S. application Ser. No. 12/122,950 entitled COMMON MODE FILTER SYSTEM AND METHOD FOR A SOLAR POWER INVERTER, which is incorporated herein by reference provides additional details that may be utilized in connection with realizing a bipolar array, and for coupling one or more bi-polar arrays to a distribution system without a transformer.

In many embodiments, the array 106 provides 1200 VDC maximum differential open-load voltages that do not exceed the 600 VDC-to-ground NEC limits While processing power, PV array 106 ground referencing may be derived from a star-point ground on the AC distribution system through the switching action of the power conversion component 108 (e.g., inverter).

In general, the power conversion component 108 converts power that is applied by the array 106 from one form to another form. In some embodiments, the power conversion component 108 includes an inverter to convert DC power provided by the array to AC power. In other embodiments, the power conversion component 108 includes DC to DC power conversion components, which may be used to convert the power from the array 106 to a higher or lower voltage.

The distribution system 110 generally operates to distribute power from the array 106 and power conversion component 108 to the premises where the array 106 and power conversion component 108 is located and/or to a utility distribution system. In many embodiments the distribution system 110 includes an AC distribution system and associated AC components such as transformers. In other embodiments, however, it is contemplated that the distribution system 110 may include DC distribution components to distribute DC power to remote locations.

One of the most challenging issues for solar PV system designers is placement of the power conversion component 108. Although it is often desirable to place the power conversion equipment 108 (e.g., an inverter) adjacent to the solar array 106, this placement is often not physically possible and/or cost efficient. And the greater the distance between the array 106 and the power conversion equipment 108, the more cost is incurred due to wiring cost and the greater the DC cable losses.

In the present embodiment, the photovoltaic tie 114 connects the neutrals 120, 122 of the arrays 102, 104 without returning the neutrals 120, 122 to the power conversion component 108 (e.g., inverter). In many implementations the positive 124 and negative 126 rails of the array 106 are contained in conduit and are coupled to power conversion component 108 by conductors capable of carrying high levels (e.g., 500 Amps) of current, but a third, high-gauge neutral run between the photovoltaic tie and the power conversion component 108 is unnecessary in the present embodiment. Instead, the control 116 and tie-information 118 lines are coupled to the control portion 107 by low gauge (e.g., 16 AWG) wire and the neutrals 120, 122 may be uncoupled from the power conversion component 108 while the array 106 is applying power to the power conversion component 108. As a consequence, the neutral DC home runs, and the longlength and large diameter wires of the neutral home-run legs, not to mention the conduit and installation labor, which can amount to tens of thousands of dollars, are eliminated. As compared to a bi-polar array that is tied together remotely from the array (e.g., adjacent to or within the power conversion component 108), the distance of DC transmission current may be reduced two fold.

Thus, installation of the photovoltaic tie 114 between the arrays 102, 104 enables DC wiring losses to potentially be cut in half, and the power conversion component 108 (e.g., inverter) may be positioned near the entrance of the utility feed to the facility to reduce AC losses. The result is either higher total system efficiency or the opportunity to use fewer panels in the system installation for the same energy harvest.

Figure 2:
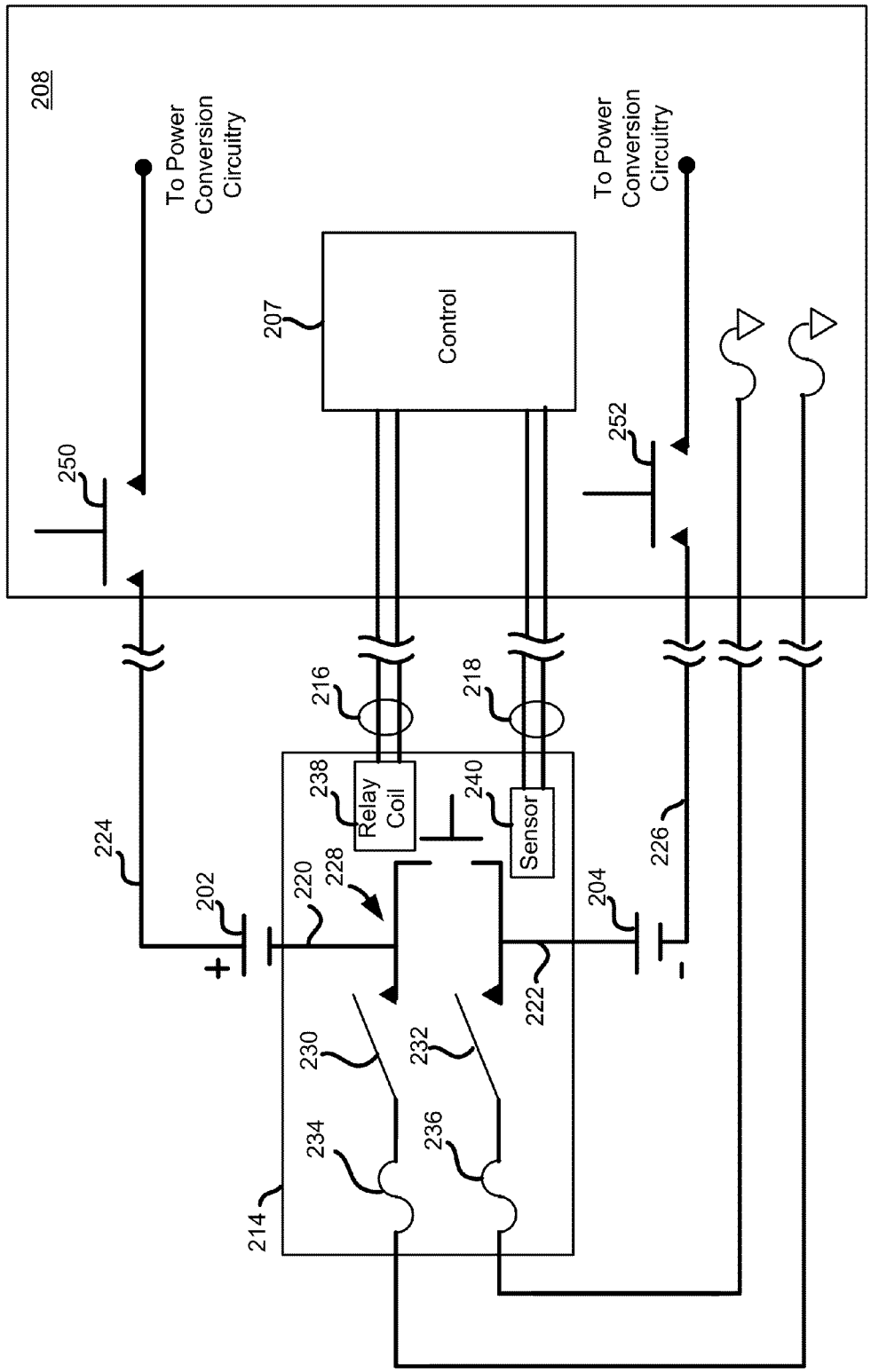
FIG. 2 is another block diagram depicting another exemplary embodiment of a photovoltaic energy conversion system.

Referring next to FIG. 2, it is a schematic view of a portion of an exemplary embodiment of the photovoltaic energy conversion system depicted in FIG. 1. As shown, a first and second arrays 202, 204 are coupled to a photovoltaic tie 214, and the photovoltaic tie 214 is coupled remotely by control lines 216 and tie-information lines 218 to a control portion 207, which in this embodiment, is housed within a power conversion component 208. In addition, a positive rail 224 of the first array 202 and a negative rail 226 of the second array 204 are switchably coupled to the energy conversion component 208.

As shown, in this embodiment a main contactor 228 is configured to couple and decouple respective neutrals 220, 222 of the first and second arrays 202, 204, and auxiliary switches 230, 232 of the photovoltaic tie 214, are configured to couple and decouple the respective neutrals 220, 222 of the first and second arrays 202, 204 to/from ground at the power conversion component 208. In particular, while the arrays 202, 204 are providing power to the power conversion component 208, the main contactor 228 is closed so as to couple the neutrals 220, 222 together and the auxiliary switches 230, 232 are opened so as to decouple the neutrals 220, 222 of the arrays 202, 204 from the power conversion component 208. In this state of operation, the neutrals 220, 222 are at or near ground potential, which may also be referred to as a "virtual ground," and there are only two conductors that apply power to the power conversion component 208: the positive rail 224 of the first array 202 and the negative rail 226 of the second array; thus expensive, high gauge neutral runs between the arrays 202, 204 and the power conversion component are eliminated.

And when the arrays 202, 204 are not providing power to the power conversion component 208 (e.g., at night), the main contactor 228 is open so as to decouple the neutrals 220, 222 of the arrays 202, 204 and the auxiliary switches 230, 232 are closed so as to couple the neutrals 220, 222 to ground via low gauge conductors (e.g., less than 5 Amps).

In many embodiments, the main switch 228 and auxiliary switches 230, 232 are integrated within a single relay device so as to enable the control portion 207 to simultaneously close the main contactor 228 while opening the auxiliary switches 230, 232 and vice versa. More specifically, the control portion 207 energizes a relay coil 238 and a sensor 240 provides a feedback signal via the tie-information lines 218 to the control portion 207 to provide status information about the state of the main contactor 228 and auxiliary switches 234, 236.

During a fault condition, DC contactors 250, 252 may be opened first to remove the virtual ground imposed on the arrays 202, 204, and once the contactors 250, 252 are opened, the main contactor 228 may be opened so as to isolate the positive and negative arrays 202, 204. Finally, the neutrals 220, 222 of the arrays 202, 204 are connected to ground with switches 230, 232. If the ground current is still present, the appropriate fuse 234, 236 will open; thus interrupting the ground current and preventing hazardous currents from flowing.

U.S. application Ser. No. 12/022,147, entitled System and Method for Ground Fault Detection and Interruption, which is incorporated herein by reference, discloses, among other technical advancements that may be utilized in connection with embodiments of the present invention, a novel structure and method to decouple components of a bipolar photovoltaic array once a ground fault condition requiring system interruption is detected.

Figure 3:
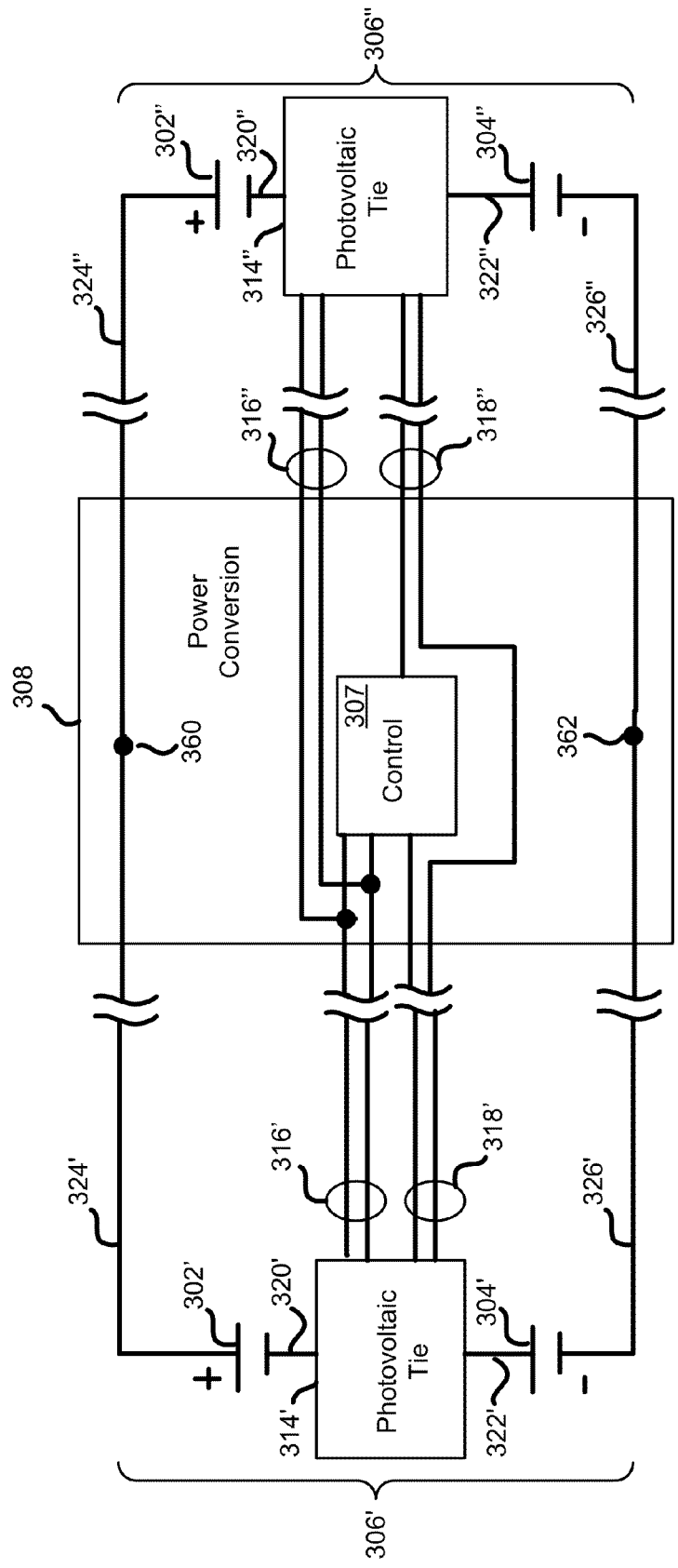
FIG. 3 is a block diagram depicting yet another exemplary embodiment of a photovoltaic energy conversion system.

Referring next to FIG. 3, shown is a block diagram of yet another embodiment of the present invention. As shown, in this embodiment two separate bipolar arrays 306', 306" are disposed in parallel so that the positive rails 324', 324" of each of the arrays 306', 306" are coupled together in the power conversion component 308 and the negative rails of each 326', 326" of each of the arrays 306', 306" are remotely coupled to a power conversion component 308. As depicted, power conversion circuitry (not shown) such as switching components of a DC to DC converter or inverter may couple to nodes 360, 362, which couple to the respective positive 324', 324" and negative 326', 326" rails of the arrays 306', 306".

In this embodiment, each of the two arrays 306', 306" may be remotely located relative to the other array and both arrays 306', 306" may be remotely located from the power conversion component 308. And while each of the two arrays 306', 306" is applying power to the power conversion portion 308, only four conductors are utilized for carrying current that is produced by the arrays 306', 306" to the power conversion component 308. As a consequence, an enormous amount of money may be saved because the high-gauge neutral lines that are ordinarily present between the arrays and the power conversion components have been eliminated.

As depicted, in this embodiment control lines 316', 316", which are utilized for controlling the switching (e.g., switching to couple the first pair 302', 304' of arrays together and the second pair 302", 304" of arrays together) of the photovoltaic ties 314', 314" are arranged in parallel and are coupled to a control portion 307, and tie-information lines 318', 318" are arranged in series so that if either of the photovoltaic ties 314', 314" fails to operate (e.g., fails to couple either the first pair 302', 304' of arrays together or the second pair 302", 304" of arrays together), then the control portion 307 does not receive feedback indicating the arrays are online and the control portion 307 will prevent the power conversion component 308 from operating.

Figure 4:
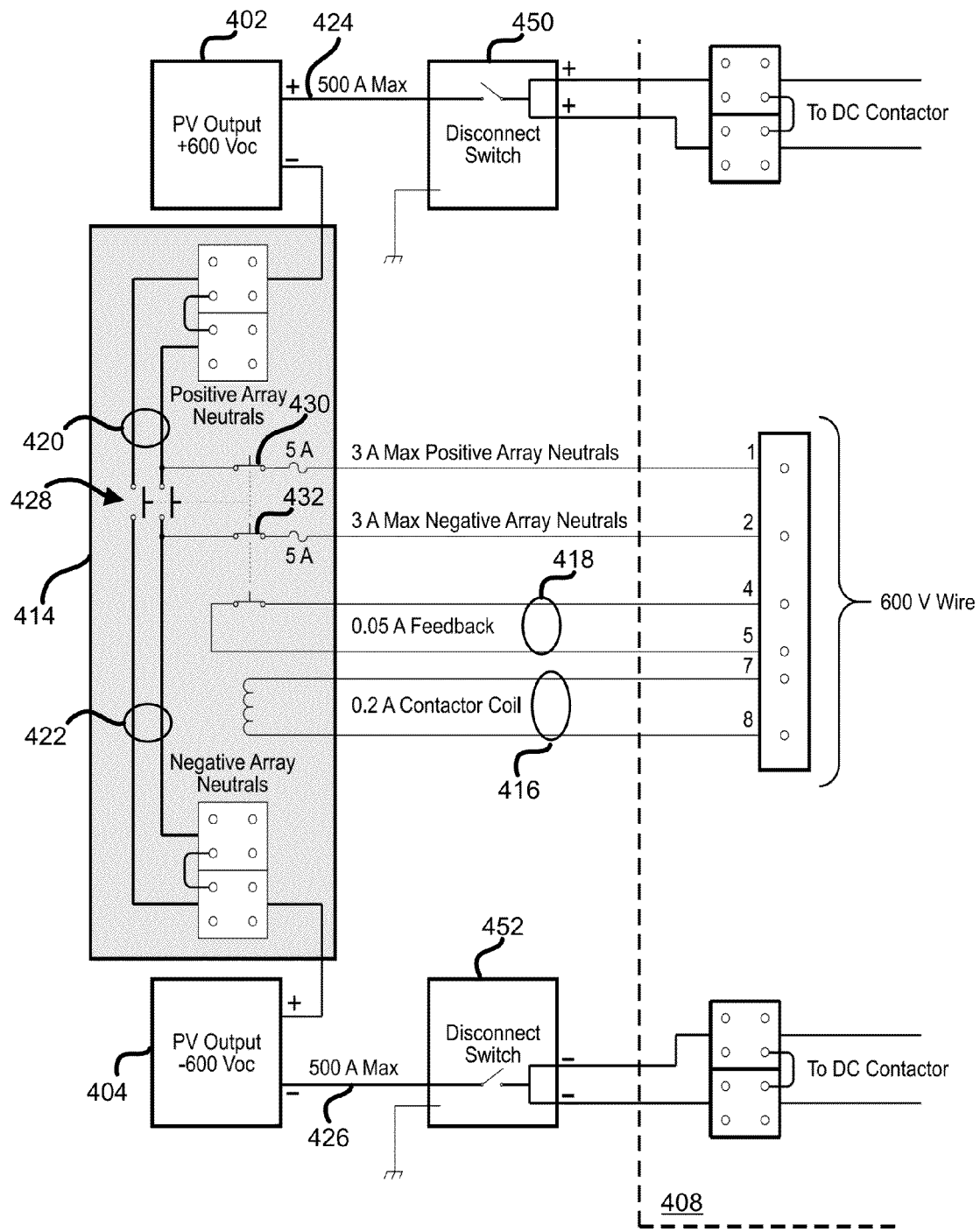
FIG. 4 is a block diagram depicting a particular embodiment of a photovoltaic energy conversion system.

Referring next to FIG. 4, it is a schematic view of a portion of another exemplary embodiment of the photovoltaic energy conversion system depicted in FIG. 1. As shown, a first and second arrays 402, 404 are coupled to a photovoltaic tie 414, and the photovoltaic tie 414 is coupled remotely by control lines 416 and tie-information lines 418 to a power conversion component 408. In addition, a positive rail 424 of the first array 402 and a negative rail 426 of the second array 404 are coupled by disconnect switches 450, 452 to the energy conversion component 408.

As shown, in this embodiment a main contactor 428 is configured to couple and decouple respective neutrals 420, 422 of the first and second arrays 402, 404, and auxiliary switches 430, 432 of the photovoltaic tie 414, are configured to couple and decouple the respective neutrals 420, 422 of the first and second arrays 402, 404 to/from a ground contact at the power conversion component 408. In particular, while the arrays 402, 404 are providing power to the power conversion component 408, the main contactor 428 is closed so as to couple the neutrals 420, 422 together and the auxiliary switches 430, 432 are open so as to decouple the neutrals 420, 422 of the arrays 402, 404 from the power conversion component 408. In this state of operation, the neutrals 420, 422 are at or near ground potential, and there are only two conductors that apply power to the power conversion component 408: the positive rail 424 of the first array 402 and the negative rail 426 of the second array 404; thus expensive neutral runs between the arrays 402, 404 and the power conversion component are eliminated.

Figure 5:
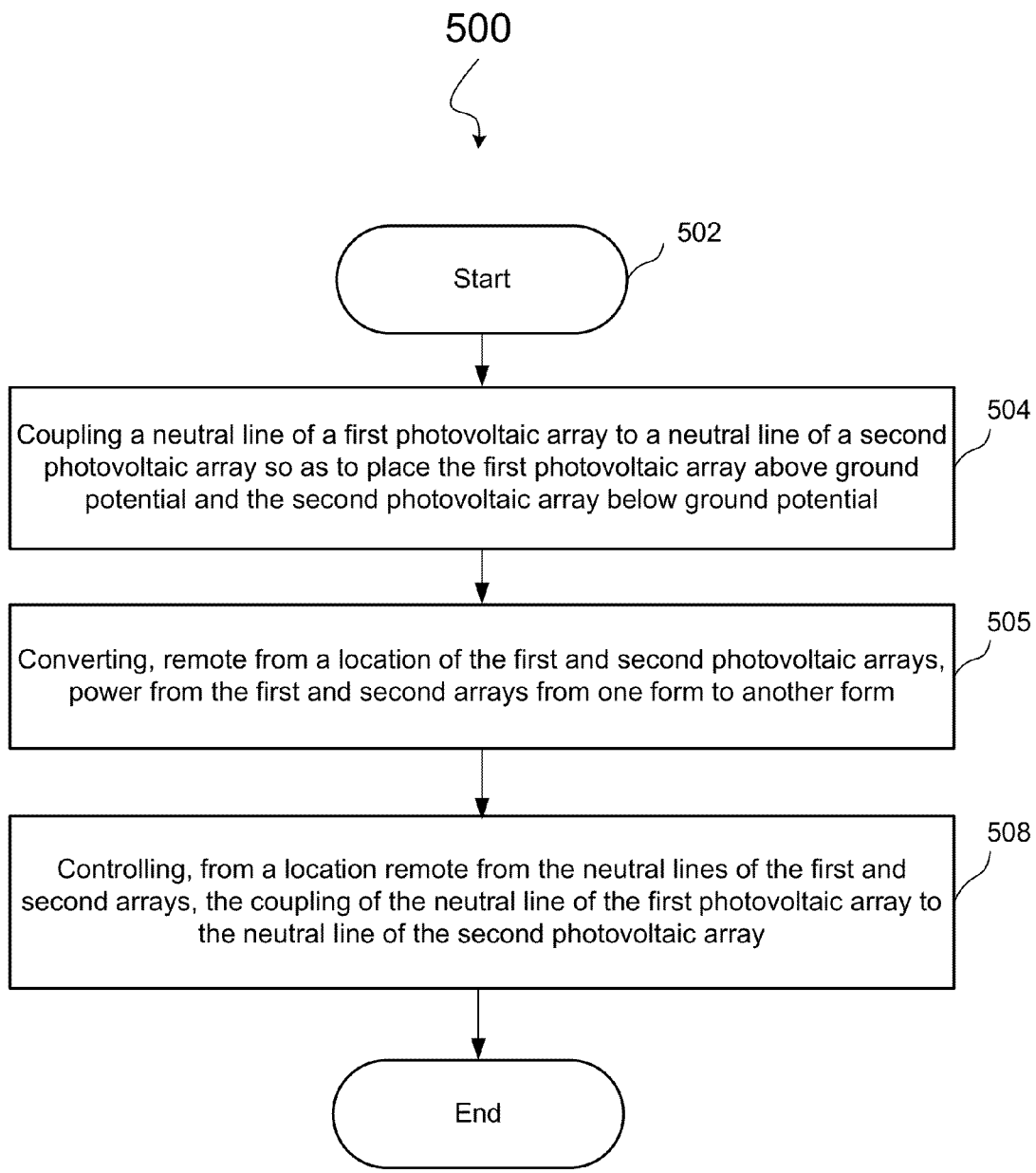
FIG. 5 is a flowchart depicting a method that may be carried out in connection with the embodiments discussed with reference to FIGS. 1-4.

Referring next to FIG. 5, it is a flowchart depicting an exemplary method that may be carried out in connection with the embodiments depicted in FIGS. 1-4. As shown, a neutral line (e.g., neutral line 120, 220, 320', 320", 420) of a first photovoltaic array (e.g., array 102, 202, 302', 302", 402) is coupled (e.g., by photovoltaic tie 114, 214, 314', 314", 414) to a neutral line (e.g., neutral line 122, 222, 322', 322", 422) of a second photovoltaic array (e.g., array 104, 204, 304', 304", 404) so as to place the first photovoltaic array above ground potential and the second photovoltaic array below ground potential (Blocks 502, 504). As discussed, by coupling neutrals of arrays (e.g., to keep the neutrals at virtual ground), the need to install expensive, heavy gauge neutral wires from the arrays, which are typically located on a roof or another remote location, to an electrical service panel (that is typically in close proximity to where power conversion and distribution equipment is located) is avoided.

As depicted in FIG. 5, power from the first and second arrays is then converted (e.g., by power conversion component 108, 208, 308, 408), remote from a location of the first and second photovoltaic arrays, from one form to another form (Block 505). As discussed, in some embodiments DC power from the arrays is converted to DC power at a higher voltage, and in many embodiments, the DC power from the arrays is converted to AC power.

In several embodiments, control (e.g., carried out by control portions 107, 207, 307) of the coupling of the neutral line of the first photovoltaic array to the neutral line of the second photovoltaic array is carried out, at least in part, from a location remote from the neutral lines of the first and second arrays (Block 508).

In conclusion, the present invention provides, among other things, a system and method for coupling photovoltaic arrays with energy conversion and/or energy distribution equipment. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A photovoltaic energy conversion system comprising:
a first photovoltaic array configured to generate a direct current (DC) power, wherein the first photovoltaic array is disposed above ground potential and includes a positive rail and a first neutral line;
a second photovoltaic array configured to generate a direct current (DC) power, wherein the second photovoltaic array is disposed below ground potential and includes a negative rail and a second neutral line;
a power conversion component remotely coupled to both, the positive rail of the first photovoltaic array and the negative rail of the second photovoltaic array, the power conversion component adapted to convert a voltage between the positive rail of the first photovoltaic array and the negative rail of the second photovoltaic array from one form to another form; and
a photovoltaic tie coupled between the first photovoltaic array and the second photovoltaic array, the photovoltaic tie includes a first switch to couple the first neutral line of the first photovoltaic array to the second neutral line of the second photovoltaic array while the first and second photovoltaic arrays are providing power to the power conversion component and the photovoltaic tie includes second and third switches that couple the first neutral line of the first photovoltaic array and the second neutral line of the second photovoltaic array, respectively, to ground when the first neutral line of the first photovoltaic array is not coupled to the second neutral line of the second photovoltaic array.

2. The system of claim 1, including a control portion located remotely from the photovoltaic tie, the control portion coupled to the photovoltaic tie by a control line and a feedback line.

3. The system of claim 2, wherein the control portion is housed within the power conversion component.

4. The system of claim 1, wherein the power conversion component is selected from the group of an inverter and a DC to DC power converter.

5. The system of claim 1, wherein the voltage between the positive rail of the first photovoltaic array and the negative rail of the second photovoltaic array exceeds 800 volts.

6. The system of claim 1, wherein an open-load voltage between the positive rail and a first neutral line does not exceed 600 volts.

7. The system of claim 1, wherein the first photovoltaic array and the second photovoltaic array together form a bipolar array, wherein no more than two conductors between the bipolar array and the power conversion component are rated for more than 5 Amps.

8. The system of claim 1, wherein the photovoltaic tie includes a switching component to couple the first neutral line and the second neutral line to ground when the first and second photovoltaic arrays are not providing power to the power conversion component.

9. The system of claim 8, wherein the photovoltaic tie and the power conversion component are coupled together so as to enable the first neutral line and the second neutral line are coupled to ground at the power conversion component when the first and second photovoltaic arrays are not providing power to the power conversion component.

* * * * *